(12) United States Patent
Lamb et al.

(10) Patent No.: US 7,377,177 B1
(45) Date of Patent: May 27, 2008

(54) PRESSURE SENSOR METHOD AND APPARATUS

(75) Inventors: Wayne A. Lamb, London, OH (US); Lamar F. Ricks, Lewis Center, OH (US); Alistair D. Bradley, Dublin, OH (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/789,512

(22) Filed: Apr. 24, 2007

Related U.S. Application Data

(60) Provisional application No. 60/911,554, filed on Apr. 13, 2007.

(51) Int. Cl.
*G01L 7/00* (2006.01)
(52) U.S. Cl. .................................... 73/756
(58) Field of Classification Search ............... 73/756
See application file for complete search history.

(56) References Cited

U.S. PATENT DOCUMENTS

| | | | | |
|---|---|---|---|---|
| 5,948,989 | A * | 9/1999 | Ichikawa et al. ............. | 73/708 |
| 5,948,991 | A * | 9/1999 | Nomura et al. ............... | 73/727 |
| 6,050,146 | A * | 4/2000 | Nakamura et al. ............ | 73/725 |
| 6,615,669 | B1 * | 9/2003 | Nishimura et al. ........... | 73/756 |
| 6,769,319 | B2 | 8/2004 | McDonald et al. ......... | 73/866.1 |
| 7,082,835 | B2 | 8/2006 | Cook et al. .................. | 73/715 |
| 7,100,453 | B2 | 9/2006 | Wang et al. .................. | 73/715 |
| 2005/0072245 | A1 * | 4/2005 | Ernsberger et al. ........... | 73/753 |
| 2006/0059994 | A1 | 3/2006 | Cameron et al. ............. | 73/700 |
| 2006/0123916 | A1 | 6/2006 | Parker et al. ................. | 73/754 |
| 2006/0213275 | A1 | 9/2006 | Cobianu et al. .............. | 73/754 |

* cited by examiner

*Primary Examiner*—Andre J Allen
(74) *Attorney, Agent, or Firm*—Kermit D. Lopez; Luis M. Ortiz

(57) ABSTRACT

A pressure sensor apparatus and a method of forming the same. A substrate (e.g., PCB) can be provided that includes a top side and a bottom side. A pressure transducer can be directly bonded to the top side of the substrate, wherein the substrate comprises substrate walls forming a plated through-hole that allows for the passage of a sensed media to contact a back side of the pressure transducer. Thereafter, a metal carrier with an integral port is bonded to the bottom side of the substrate, thereby forming a chip-on-board pressure sensor in which the need for a plating or coating to allow adhesion between the pressure transducer and the metal carrier is eliminated. The pressure transducer may comprise, for example, silicon or silicon bonded to glass. The metal carrier can be provided with a feature that mates with a valve such as a Schrader valve.

20 Claims, 6 Drawing Sheets

PRESSURE SENSOR METHOD AND APPARATUS

CROSS-REFERENCE TO RELATED PATENT APPLICATION

This patent application claims priority to U.S. Provisional Patent Application Ser. No. 60/911,554, filed on Apr. 13, 2007, and which is incorporated herein by reference in its entirety.

TECHNICAL FIELD

Embodiments are generally related to pressure sensors and transducers. Embodiments are also related to Chip-on-Board components and configurations. Embodiments are additionally related to chip-on-board pressure sensor packages.

BACKGROUND OF THE INVENTION

Many processes and devices have been used in the field of pressure sensing. Pressure sensors are generally used and deployed wherever a need for monitoring and responding to pressure changes is necessary. Pressure sensors are commonly used in a variety of automotive, aerospace, commercial, industrial, and consumer applications.

The operational environments in which pressure sensors are required to operate in these applications with high accuracy and repeatability can be very demanding. For example, extreme thermal conditions including thermal shocks in ranges from 160 C to −55 C, exposure to harsh and/or conductive media, withstand high overpressure (proof pressure) cycling without change in calibration and survive high peak (burst) pressures to protect system from potentially catastrophic leaks.

In the case of a pressure sensor that relies upon the use of a pressure transducer (or sense element) including piezoresistive silicon on an etched silicon diaphragm, a most cost effective solution for operating in such environments is to use so called "back-side" sensing. With this arrangement the only parts of sensor which are exposed to the media are the electrically isolated cavity side of the pressure transducer, the adhesive used to bond the transducer die to a substrate and finally the substrate itself.

FIGS. 1-4 illustrate example prior art pressure sensor apparatus configurations. FIG. 1 illustrates a cross sectional view of a prior art direct chip-on-board mounted pressure sensor apparatus 100. The configuration illustrated in FIG. 1 generally includes a pressure transducer/die 102 that is attached to a printed circuit board (PCB) substrate 106 with the assistance of a die-attach adhesive 104. A plurality of bond wires 110 are also depicted in the configuration illustrated in FIG. 1. The bottom portion of the pressure sensor apparatus 100 includes a housing 108. A top cover 105 or protective portion is also included. The configuration depicted in FIG. 1 is generally presented for background and edification purposes only and is not considered a limiting feature of the disclosed embodiments.

FIG. 2 illustrates a side sectional view of another prior art sensor apparatus 200. FIG. 3 illustrates a portion of a prior art sensor system 400 in which the sensor apparatus 200 can be implemented, while FIG. 4 illustrates a larger view of the system 400 together with the prior art pressure sensor apparatus 200. FIGS. 2-4 are illustrated as a contrast to the improved sensor apparatus 500, which is described in greater detail herein. Note that in FIGS. 2-4, identical or similar parts or elements are generally indicated by identical reference numerals. The prior art sensor apparatus generally includes a PCB (Printed Circuit Board) 201 in association with one or more bond wires 204, 255, and 257. An electronic component 212 can communicate with the PCB 201 via bond wires 255 and 257. Similarly, an electronic component 243 can communicate with the PCB 201 via the bond wire 204.

An adhesive or glue 209 is generally utilized to maintain a contact clip 202 with respect to the PCB 201. A glue 208 can also be utilized to maintain the component 243 to the carrier 204. Additionally, a cover or housing 203 surrounds the components 243 and 212. An adhesive may be utilized to maintain the component 212 to the PCB 201. The pressure sensor apparatus 200 includes the carrier 204 in which a port 251 is disposed and configured within the carrier 204. As shown in FIG. 3, the carrier 204 can be configured from a rigid material 207, which is preferably a metal such as aluminum in order to ensure that the carrier 204 is rigid. A section 402 as depicted in FIG. 4 generally constitutes a fitting while the area 404 can include threads. Areas 207 and 402 together can constitutes a valve such as a Schrader valve. The port 251 depicted in the prior art configuration of FIG. 204 extends toward and into an area 261 of the carrier 204. The area 261 thus extends through the cross section of PCB 201, offering a limited area for component attachment.

One of the problems with the prior art configurations illustrated in FIGS. 1-4 is that such designs need to operate reliably under the conditions described earlier and with the use of attach materials which have high strength and chemical resistance. The rigid mounting of a stress sensitive die (e.g., pressure transducer), for example, onto a PCB where there is a large mismatch in thermal expansion coefficient between the die and the PCB can introduce high levels of package stress, which can result in output errors, non-repeatability and potentially, mechanical damage.

Pressure sensor designs are known, which include the use of a Si piezoresistive die mounted to a metal carrier via an adhesive or epoxy. Such metal carriers not only serve as a substrate or pedestal, but when assembled in the final product design also serve to mate, for example, with a Schrader valve in an automotive HVAC system. These metal carriers are typically made of aluminum, which is known to possess a high affinity for oxygen and quickly forms oxides when exposed to the open environment and adversely affects adhesion. Other times, a plating or coating must be implemented to allow adhesion between the silicon pressure die and the metal carrier. Common platings in the field use chromium and this material is being eliminated from use in a number of countries, including those in Europe. Removing this material from the plating does not allow for a strong bond between the sense die and the carrier. Therefore, in order to overcome this problem, it is believed that a solution lies in the implementation of an improved pressure sensor method and system, which is disclosed in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved pressure sensor apparatus and method of forming the same.

It is a further aspect of the present invention to provide for an improved package for a chip-on-board pressure sensor.

The aforementioned aspects and other objectives and advantages can now be achieved as described herein. A pressure sensor apparatus and a method of forming the same are disclosed. A substrate (e.g., PCB) can be provided that includes a top side and a bottom side. A pressure transducer can be directly bonded to the top side of the substrate, wherein the substrate comprises substrate walls forming a plated through-hole that allows for the passage of a sensed media to contact a back side of the pressure transducer. Thereafter, a metal carrier with an integral port is bonded to the bottom side of the substrate, thereby forming a chip-on-board pressure sensor in which the need for a plating or coating to allow adhesion between the pressure transducer and the metal carrier is eliminated. The pressure transducer may comprise, for example, silicon and the metal carrier can be provided with a feature that mates with a valve such as a Schrader valve. The pressure transducer is preferably configured primarily from silicon (e.g., a silicon part), which can be optionally bonded to glass to provide some package stress isolation for the pressure sensor apparatus.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
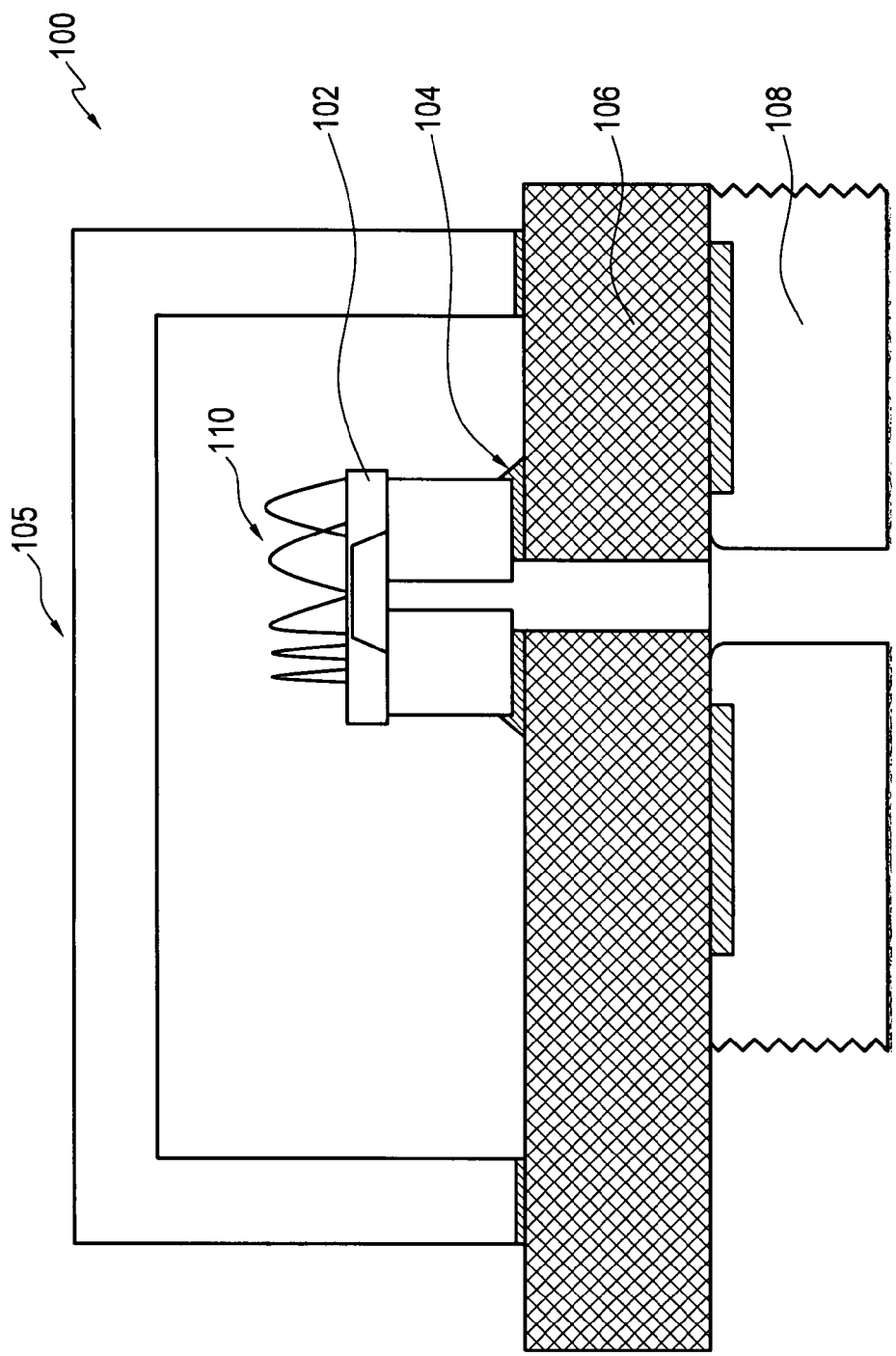
FIG. 1 illustrates a cross sectional-view of a prior art direct chip-on-board mounting method and system.
Figure 2:
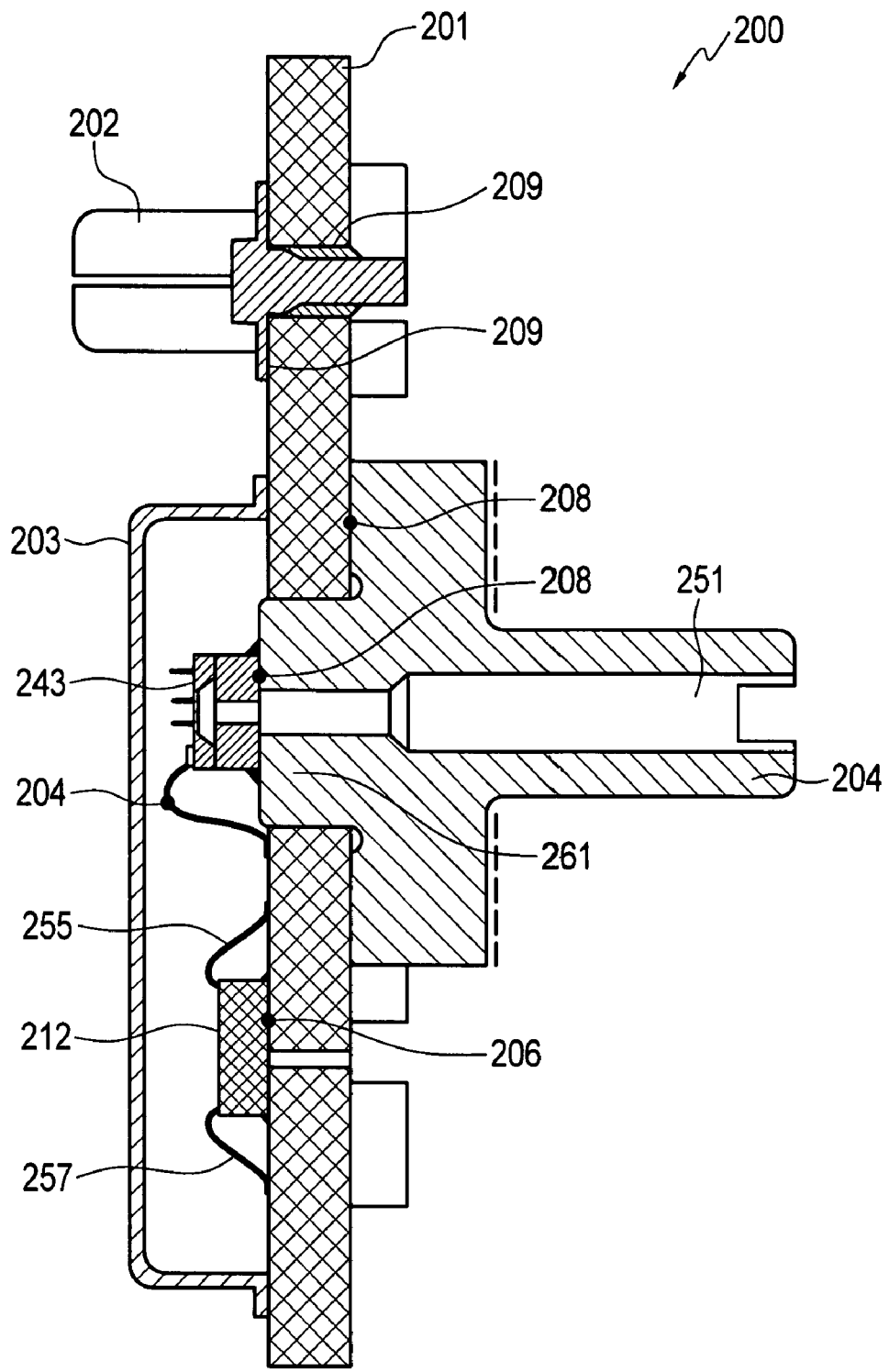
FIG. 2 illustrates a side-sectional view of another prior art pressure sensor apparatus.
Figure 3:
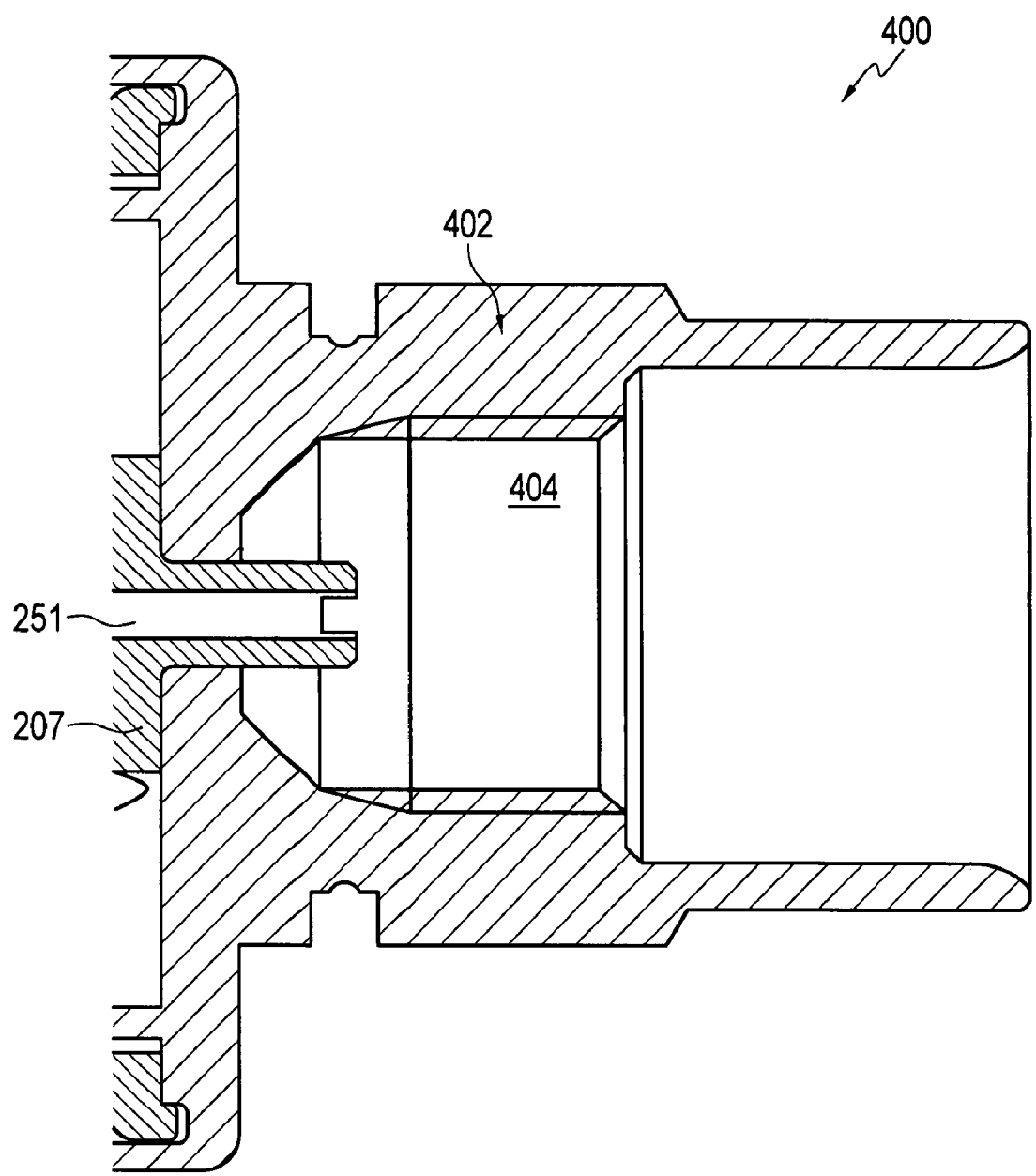
FIG. 3 illustrates a portion of a prior art pressure sensor system in which the pressure sensor apparatus depicted in FIG. 2 can be implemented.
Figure 4:
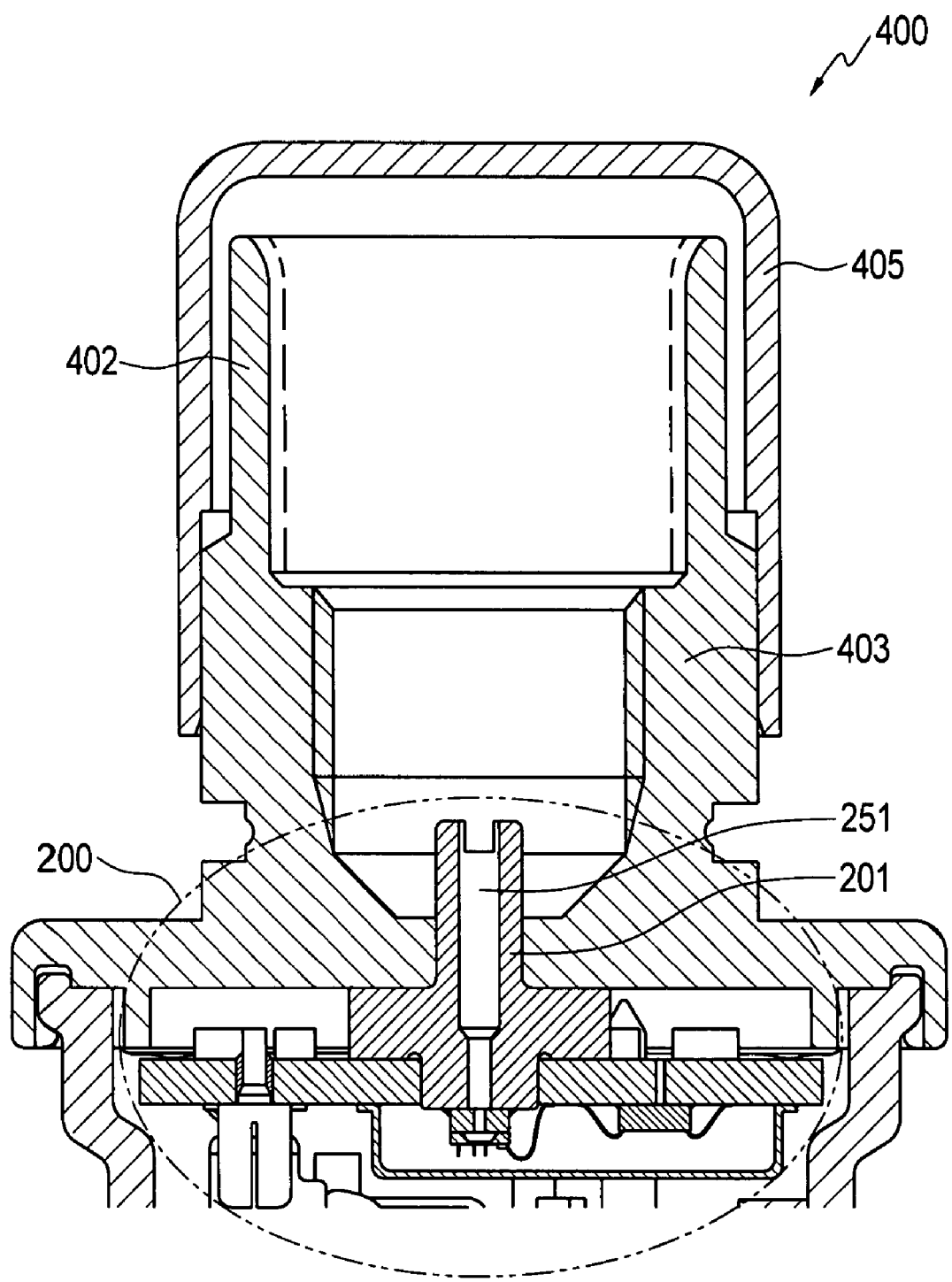
FIG. 4 illustrates a larger view of the pressure sensor system depicted in FIG. 4.
Figure 5:
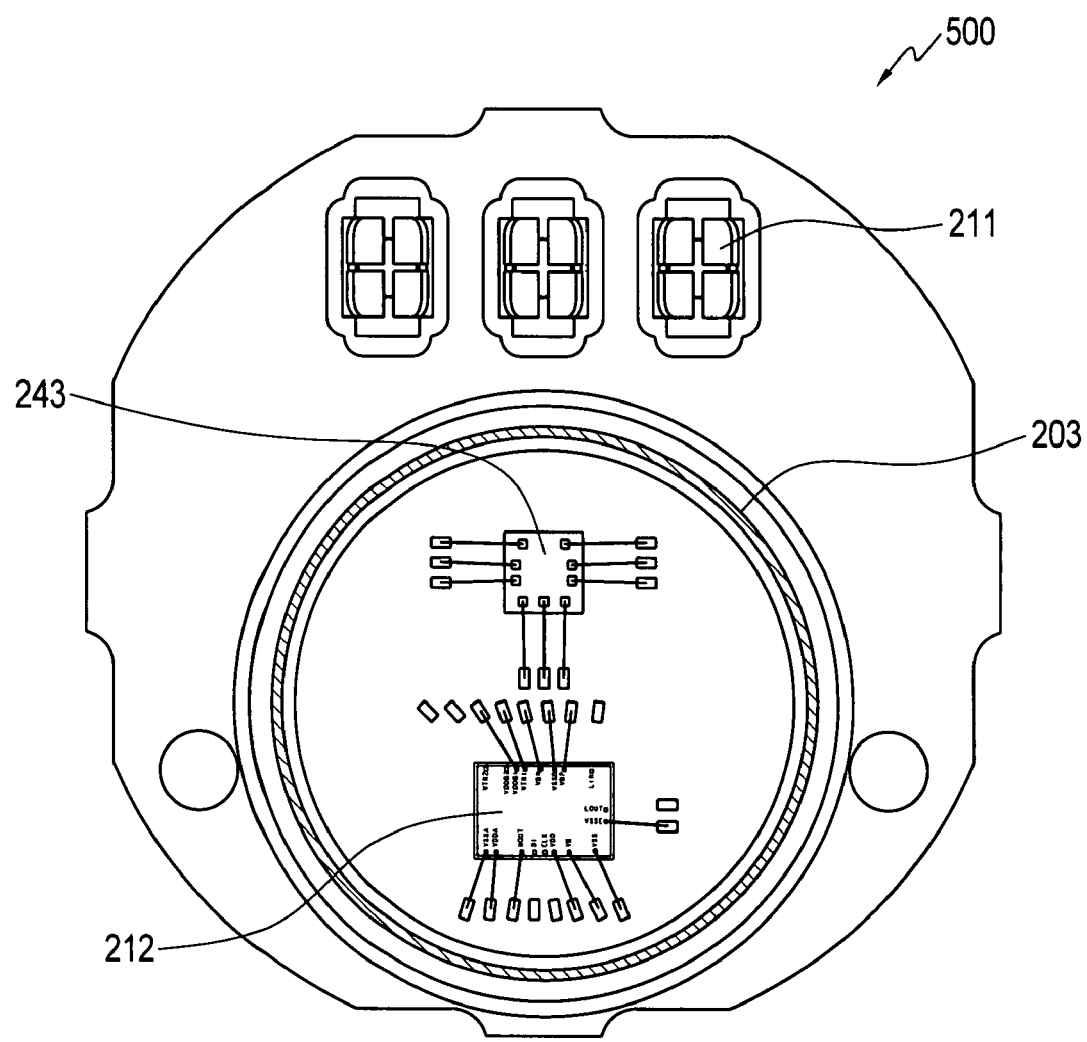
FIG. 5 illustrates bond side view of an improved pressure sensor apparatus, which can be implemented, in accordance with alternative preferred embodiment.
Figure 6:
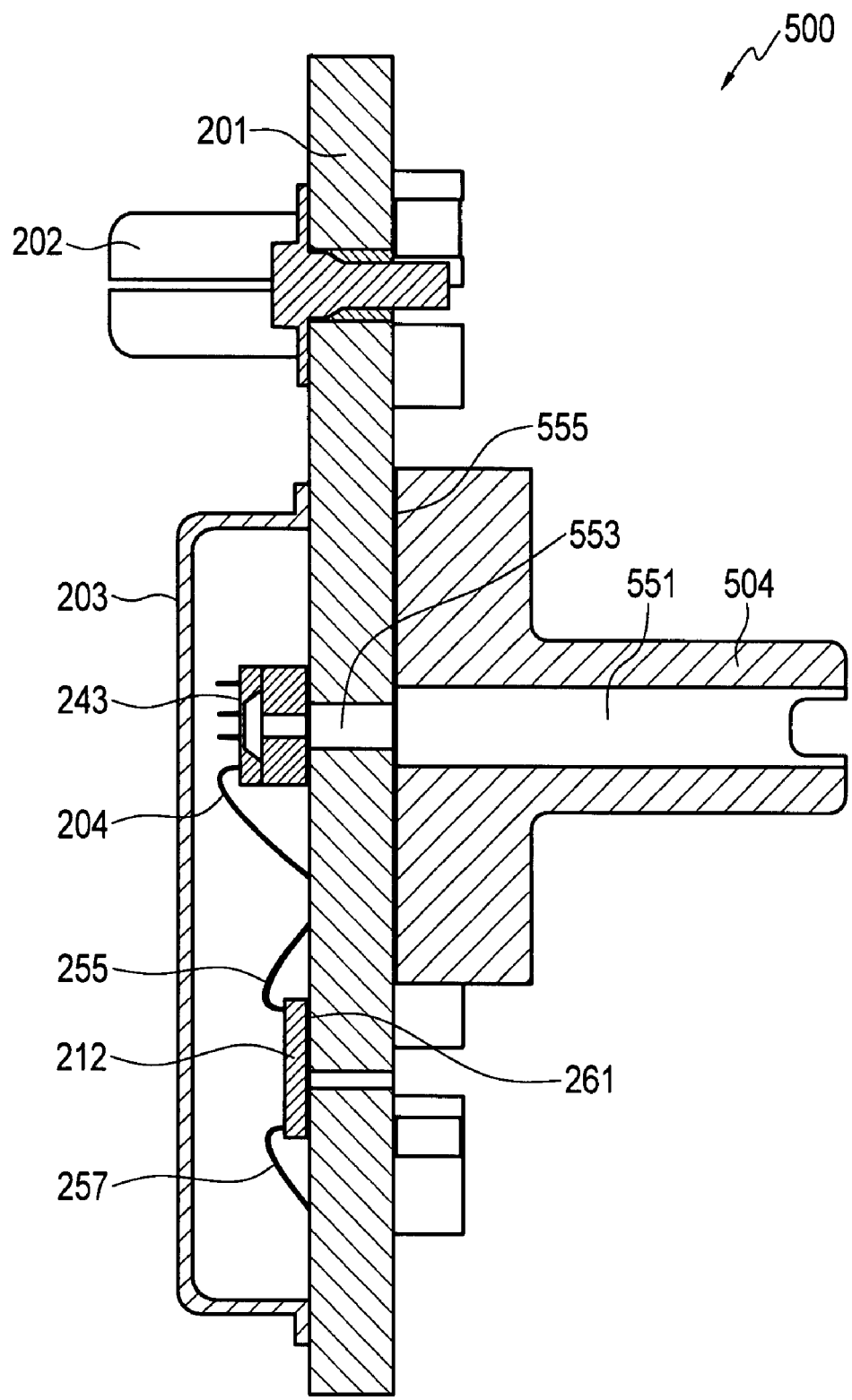
FIG. 6 illustrates a side-sectional view of the improved pressure sensor apparatus depicted in FIG. 5 in accordance with a preferred embodiment.

Referring now to the drawings and in particular to FIG. 5, a bond-side view of a pressure sensor apparatus 500 is illustrated, which can be implemented in accordance with a preferred embodiment. Additionally, FIG. 6 illustrates a side sectional view of the pressure sensor apparatus 500 depicted in FIG. 5 in accordance with a preferred embodiment. Note that in FIGS. 5-6, identical or similar parts or elements are generally indicated by identical reference numerals. Additionally, FIGS. 5-6 illustrate components which are also depicted in the prior art illustrations of FIGS. 2-4. It can be appreciated, however, that such components are shown in FIGS. 5-6 in order to demonstrate the improvements and differences between apparatus 500 and that of the prior art apparatus 200.

The pressure sensor apparatus 500 depicted in FIGS. 5-6 generally includes one or more pressure transducer(s) 243 formed on a substrate 201, which can be, for example a PCB (Printed Circuit Board) substrate. The pressure sensor apparatus 500 additionally includes a contact clip 202 in association with an adhesive 209 and glue 208. A cover 203 can also be provided as a part of the pressure sensor apparatus 500. Electrical component 212 and pressure transducer 243 are generally attached to the substrate 201. Additionally, one or more electrical components 211 (e.g., ASIC) can be located on the substrate 201 in association with the pressure transducer 243 and the electrical component 212. Note that the electrical component 212 may also be an ASIC or another suitable electrical component.

One or more bond wires 204 can also be provided, which are connected to the substrate 201 and the pressure transducer 243. The pressure sensor apparatus 500 additionally includes a metal carrier 504 which is configured to include a port 551 therein. Note that the pressure transducer 243 is preferably configured primarily from silicon (e.g., a silicon part), which can be optionally bonded to glass to provide some package stress isolation for the pressure sensor apparatus 500. In the configuration depicted in FIG. 6, the metal carrier 504 stops at the substrate 201 rather than proceeding through the substrate, which is the case with the prior art pressure sensor apparatus 200 described earlier. The port 551 can communicate with another gap or through-hole 553, but the carrier 504 itself does not include an area such as the area 261 described earlier with respect to the prior art apparatus 200 depicted in FIG. 2. The improved sensor apparatus 500 represents an improvement over the prior art configuration depicted in FIG. 2 because bonding or sealing of the metal carrier 504 to the substrate 201 is easier to maintain and does not require the use of a coating. Note that in FIG. 6, a line 555 distinguishes the PCB 201 from the metal carrier 504.

The pressure sensor apparatus 500 is based on a chip-on-board approach that eliminates the known issues of bonding the pressure transducer 243 to the metal carrier 504. Pressure sensor apparatus 500 is based on a design in which the pressure transducer 243 is bonded directly to a top side of the substrate 201 (e.g., PCB) with a plated through-hole 553 that allows for the passage of the sensed media to contact the backside of the pressure transducer 243. Note that the pressure transducer 243 can be formed from, for example, silicon or silicon and glass, depending upon design considerations. The metal carrier 504 is configured with the integral port 251. The metal carrier 504 is then bonded to the bottom side of the PCB or substrate 201.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for configuring a chip-on-board pressure sensor, comprising:
   providing a substrate having a top side and a bottom side;
   directly bonding a pressure transducer to said top side of said substrate, wherein said substrate comprises substrate walls forming a plated through-hole that allows for the passage of a sensed media to contact a back side of said pressure transducer;

thereafter bonding a metal carrier to said bottom side of said substrate, thereby forming a chip-on-board pressure sensor in which the need for a plating or coating to allow adhesion between said pressure transducer and said metal carrier is eliminated.

2. The method of claim 1 wherein said substrate comprises a PCB (Printed Circuit Board).

3. The method of claim 1 further comprising primarily configuring said pressure transducer from silicon.

4. The method of claim 3 wherein further comprising optionally bonding said pressure transducer to glass in order to provide a package stress isolation thereof.

5. The method of claim 1 further comprising configuring said metal carrier to comprise a feature that mates with a valve.

6. The method of claim 5 wherein said valve comprises a Schrader valve.

7. The method of claim 1 wherein said metal carrier comprises aluminum.

8. The method of claim 1 wherein said metal carrier comprises an integral port formed therein.

9. The method of claim 7 wherein said metal carrier formed from aluminum comprises an integral port formed therein.

10. A chip-on-board pressure sensor apparatus, comprising:
   a substrate having a top side and a bottom side;
   a pressure transducer directly bonded to said top side of said substrate, wherein said substrate comprises substrate walls forming a plated through-hole that allows for the passage of a sensed media to contact a back side of said pressure transducer;
   bonding a metal carrier to said bottom side of said substrate, thereby forming said chip-on-board pressure sensor apparatus in which the need for plating or coating to allow adhesion between said pressure transducer and said metal carrier is eliminated.

11. The apparatus of claim 10 wherein said substrate comprises a PCB (Printed Circuit Board).

12. The apparatus of claim 10 wherein said pressure transducer is primarily configuring from silicon.

13. The apparatus of claim 12 wherein said pressure transducer is optionally bonded to glass in order to provide a package stress isolation thereof.

14. The apparatus of claim 10 wherein said metal carrier comprises a feature that mates with a valve.

15. The apparatus of claim 14 wherein said valve comprises a Schrader valve.

16. The apparatus of claim 10 wherein said metal carrier comprises aluminum.

17. The apparatus of claim 10 wherein said metal carrier comprises an integral port formed therein.

18. A chip-on-board pressure sensor apparatus, comprising:
   a PCB having a top side and a bottom side;
   a pressure transducer directly bonded to said top side of said PCB, wherein said PCB comprises PCB walls forming a plated through-hole that allows for the passage of a sensed media to contact a back side of said pressure transducer;
   bonding a metal carrier bonded with an integral port to said bottom side of said PCB, thereby forming said chip-on-board pressure sensor apparatus in which the need for plating or coating to allow adhesion between said pressure transducer and said metal carrier is eliminated.

19. The apparatus of claim 18 wherein said pressure transducer is configured primarily from silicon.

20. The apparatus of claim 19 wherein said pressure transducer is optionally bonded to glass in order to provide a package stress isolation thereof.

* * * * *